United States Patent
Kang et al.

(10) Patent No.: US 8,294,229 B2
(45) Date of Patent: Oct. 23, 2012

(54) WAFER-SCALE ARRAY OF OPTICAL PACKAGES AND METHOD FOR FABRICATING THE SAME

(75) Inventors: Shinill Kang, Seoul (KR); Ji Seok Lim, Gyeonggi-do (KR); Min Seok Choi, Pusan (KR); Ho Kwan Kim, Seoul (KR)

(73) Assignee: Industry-Academic Co-Operation Foundation, Yonsei University (KR)

( * ) Notice: Subject to any disclaimer, the term of this patent is extended or adjusted under 35 U.S.C. 154(b) by 164 days.

(21) Appl. No.: 12/812,357

(22) PCT Filed: Jan. 12, 2009

(86) PCT No.: PCT/KR2009/000153
§ 371 (c)(1),
(2), (4) Date: Jul. 9, 2010

(87) PCT Pub. No.: WO2009/088267
PCT Pub. Date: Jul. 16, 2009

(65) Prior Publication Data
US 2010/0283113 A1    Nov. 11, 2010

(30) Foreign Application Priority Data
Jan. 10, 2008 (KR) .......... 10-2008-0003159

(51) Int. Cl.
*H01L 31/0232* (2006.01)
(52) U.S. Cl. ......... 257/432; 257/E31.127; 359/819; 438/66
(58) Field of Classification Search .......... 257/432, 257/E31.127–E31.129; 359/819; 438/66, 438/67
See application file for complete search history.

(56) References Cited

U.S. PATENT DOCUMENTS
2006/0043262 A1* 3/2006 Akram .......... 250/208.1

FOREIGN PATENT DOCUMENTS
| KR | 20010003000 A | 1/2001 |
| KR | 20060013125 A | 2/2006 |
| KR | 20060045888 A | 5/2006 |
| KR | 20070049846 A | 5/2007 |

OTHER PUBLICATIONS
International Search Report, PCT/KR2009/00153, dated Sep. 8, 2009.

* cited by examiner

*Primary Examiner* — Julio J Maldonado
*Assistant Examiner* — Daniel Shook
(74) *Attorney, Agent, or Firm* — Lerner, David, Littenberg, Krumholz & Mentlik, LLP

(57) ABSTRACT

A wafer-scale array of optical packages and a method for fabricating the same. The wafer-scale array of optical packages includes at least one wafer-scale array of lens structures, including a wafer-scale array of first barrel structures and a wafer-scale array of lenses directly formed on the wafer-scale array of first barrel structures such that the wafer-scale array of lenses is integrally combined with the wafer-scale array of first barrel structures, the wafer-scale array of first barrel structures being made of a material different from a material of the lens of the wafer-scale array of lenses; and at least one wafer-scale array of second barrel structures stacked on and combined with the at least one wafer-scale array of lens structures.

35 Claims, 9 Drawing Sheets

WAFER-SCALE ARRAY OF OPTICAL PACKAGES AND METHOD FOR FABRICATING THE SAME

CROSS REFERENCE TO RELATED APPLICATIONS

The present application is a national phase entry under 35U.S.C. §371 of International Application No. PCT/KR2009/000153, filed Jan. 12, 2009, published in Korean, which claims the benefit of Korean Patent Application No. 10-2008-0003159, filed Jan. 10, 2008. The disclosures of said applications are incorporated by reference herein.

TECHNICAL FIELD

The present invention relates to a wafer-scale array of optical packages and a method for fabricating the same, and more particularly, to a wafer-scale array of optical packages and a method for fabricating the same that can serve to reduce fabrication costs by simplifying the process.

BACKGROUND ART

In response to the increased demand for portable information devices, such as mobile phones or Personal Digital Assistants (PDAs), the demand for micro-camera devices is also increasing.

At present, a micro-camera device is fabricated by mounting an image sensor on a Printed Circuit Board (PCB), attaching a holder thereon, and mounting a lens module on the holder. The lens module is fabricated by combining a single-piece optical lens with a stop, a spacer, a vignetting structure, a barrel, an infrared (IR) filter, and the like.

FIGS. 1 to 3 are schematic views showing the process of fabricating a wafer-scale array of lenses in the related art.

The lenses are the key part determining the optical performance of a camera device, and are generally formed on a wafer-sized glass substrate by a replication process.

The lens array can be obtained in a wafer size, and the pitch between the lenses is made the same as the pitch between the image sensors.

A lens material 113 is applied onto a glass substrate 111, which is prepared on a wafer-scale, molds 112, each of which has a lens cavity array, are aligned with the glass substrate 111 using alignment marks 114, and then a wafer-scale lens array 110 is produced through a replication process.

Such structure makes it impossible to design a lens that is thinner than the thickness of the glass substrate 111. In order to overcome this limitation, a method in which, for example, trenches are formed on the glass substrate 111 has been proposed. However, this has the drawback of increasing the costs of processing the substrate.

Meanwhile, the process of assembling the lens module requires strict alignment with a small tolerance, which causes the costs of manufacturing the camera device to increase. In addition, ensuring the minimum alignment tolerance required for the assembly process acts as a limitation, which makes it difficult to design an ultra-thin camera device.

In addition, the process of assembling the lens module requires an increased number of parts, since a spacer is required in each step, and an opaque layer, which acts as a stop and a vignetting structure, is required. This increases the number of processes and the overall thickness of the camera device. The opaque layer, which acts as the stop and the vignetting structure, can be formed through a deposition process. However, this also requires an additional coating process.

In addition, in the finished camera device, the glass substrate and the lens material are exposed outwards at the side thereof, and the exposed transparent layer can allow external light to enter and be incident onto an image sensor. Accordingly, an additional coating process or a process of bonding an additional attachment to block the external light is required.

DISCLOSURE

Technical Problem

The present invention has been made to solve the foregoing problems with the related art in the process of fabricating a lens module and a camera device, and therefore an object of the present invention is to replicate lenses by injecting a fixed quantity of optical resin on an opaque barrel structure that has an array of through-holes formed therein, such as a stop, a spacer, or a vignetting structure, instead of using a method of the related art, in which a glass substrate is used to form the lenses.

The present invention can reduce the number of assembly processes by reducing the number of parts that constitute an optical package.

In addition, the present invention makes it possible to reduce fabrication costs by allowing an inexpensive barrel structure made of a polymer resin to substitute for an expensive glass substrate.

In addition, the present invention makes it possible to design an ultra-thin camera device by removing the design limitation due to the thickness of the glass substrate.

Furthermore, it is possible to form lenses by injecting a fixed quantity of an optical resin into through-holes and thus prevent an unnecessary increase in thickness since the optical resin layer is not formed on an area distant from the through-holes of the barrel structure. This makes it possible to fabricate an ultra-thin camera device having a short whole length.

Moreover, neither an additional coating nor additional attachments are required, since external light is blocked. This can very advantageously contribute to the reduction of the unit cost and the miniaturization of a lens module and a camera device.

Technical Solution

In an aspect of the present invention, a wafer-scale array of optical packages includes at least one wafer-scale array of lens structures, including a wafer-scale array of first barrel structures and a wafer-scale array of lenses directly formed on the wafer-scale array of first barrel structures such that the wafer-scale array of lenses is integrally combined with the wafer-scale array of first barrel structures, the wafer-scale array of first barrel structures being made of a material different from a material of the wafer-scale array of lenses; and at least one wafer-scale array of second barrel structures stacked on and combined with the at least one wafer-scale array of lens structures.

It is preferred that the wafer-scale array of first barrel structures have a surface condition that resistance to flow of the material of the wafer-scale array of lenses in a liquid state varies according to position.

In another aspect of the present invention, a method for fabricating a wafer-scale array of optical packages includes a first step of preparing at least one wafer-scale array of lens structures by forming a wafer-scale array of lenses directly on a wafer-scale array of first barrel structures such that a wafer-scale array lens is integrally combined with a wafer-scale array of first barrel structures, the wafer-scale array of first barrel structures being made of a material different from a material of the wafer-scale array of lenses; and a second step of combining at least one wafer-scale array of second barrel structures with the at least one wafer-scale array of lens structures by stacking.

In a further aspect of the present invention, the method for fabricating an optical package includes the steps of: preparing a wafer-scale array of optical packages by the method as described above; and producing an individual optical package by dicing the wafer-scale array of optical packages.

Advantageous Effects

As set forth above, the unit price is reduced by reducing the number of parts and processes. The degree of freedom of design is improved and the size of the camera device is reduced through the removal of the design limitation due to the thickness of the glass substrate.

In addition, the unit price of products is reduced by the simplification of the assembly process.

Moreover, defects, such as voids, due to the irregular flow of the lens material injected onto through-holes can be prevented from occurring in lenses, when forming the lenses.

BEST MODE

Reference will now be made in detail to various embodiments of the present invention, examples of which are illustrated in the accompanying drawings and described below.

Figure 1:
FIGS. 1 to 3 are schematic views showing a process of fabricating a wafer-scale array of lenses of the related art.
Figure 2:
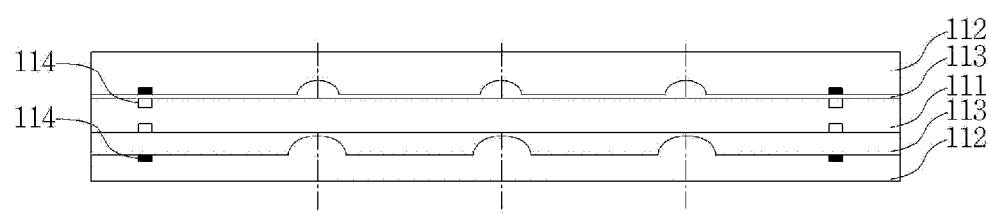
Figure 3:
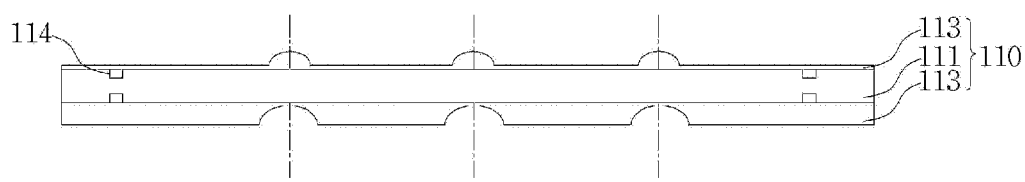
Figure 4:
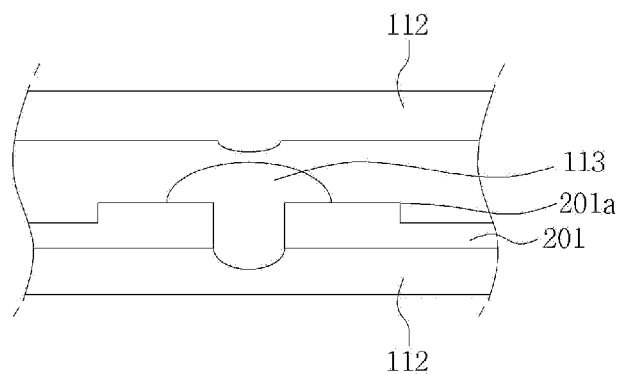
FIGS. 4 to 6 are views for explaining first barrel structures according to a first exemplary embodiment of the invention.
Figure 5:
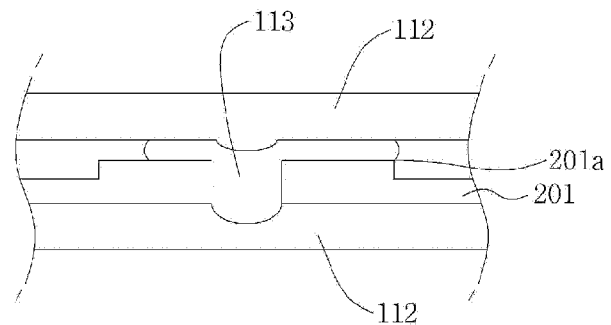
Figure 6:
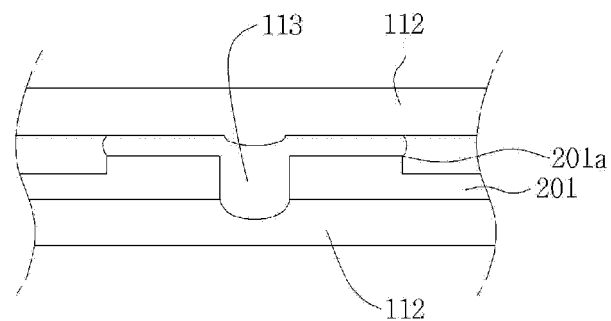

FIGS. 4 to 6 are views for explaining first barrel structures according to a first exemplary embodiment of the invention.

A wafer-scale array of first barrel structures 201 can have a surface condition that resistance to flow of a lens material 113 in a liquid state varies according to its position.

Preferably, the flow resistance is smaller at a near position that is relatively close to a wafer-scale array of lenses, i.e., an array of through-holes, than at a distant position that is far from the wafer-scale array of lenses. Restricting the flow of the liquid lens material within the near position, at which the flow resistance is small, prevents defects inside the lenses, such as voids, from occurring.

For this, as shown in FIGS. 4 to 6, the wafer-scale array of first barrel structures 201 has height differences 201a on the surface thereof. Each of the height differences 201a is higher at the near position that is relatively close to the wafer-scale array of lenses than at the distant position that is far from the wafer-scale array of lenses.

Even when a flow in a certain direction is faster and thus arrives earlier at the height difference 201a, the flow is prevented from proceeding further due to the surface tension of the lens material, but a flow in another direction can continue to proceed as long as it satisfies the following condition:

$$Fa > Fb$$

(Here, Fa is the flow resistance applied by the surface tension when the lens material has arrived at the height difference 201a, and Fb is the flow resistance applied when the lens material is proceeding within the near position, that is, the lens material has not arrived at the height difference 201a.)

The advantages of the wafer-scale array of first barrel structures 201 of FIGS. 4 to 6 can be understood from the following comparative embodiment.

Figure 10:
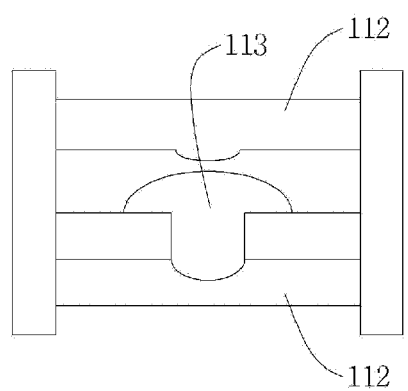
FIGS. 10 to 12 are views showing a problem occurring in first barrel structures according to another comparative embodiment.
Figure 11:
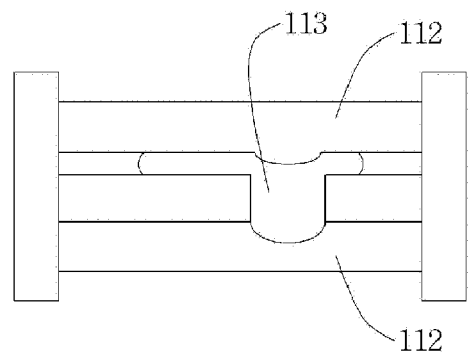
Figure 12:
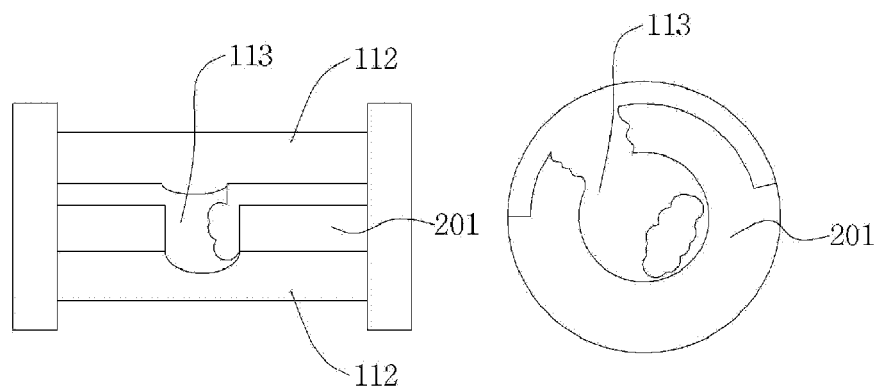

FIGS. 10 to 12 are views showing problems occurring with first barrel structures according to the comparative embodiment.

In the molding of single lens structures, a guide which serves to align upper and lower molds 112, is essential. In this case, a lens material trapped between the upper and lower molds 112 is made to propagate along a wall surface by a capillary phenomenon. This, as a result, draws out the lens material, thereby leaving defects, such as voids, inside the lens.

In FIG. 12, both a cross-sectional view and a plan view are shown.

Figure 7:
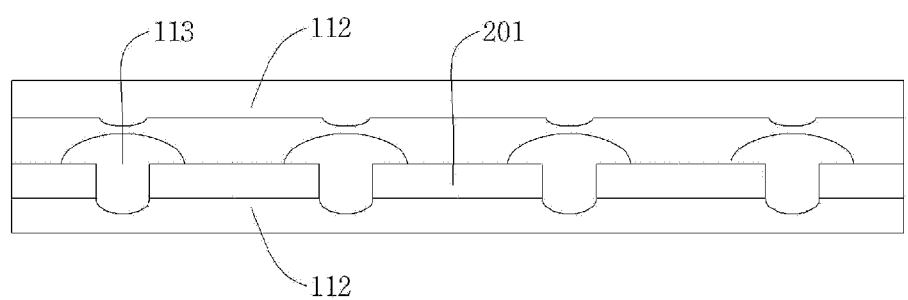
FIGS. 7 to 9 are views showing problems occurring with a wafer-scale array of first barrel structures of a comparative embodiment.
Figure 8:
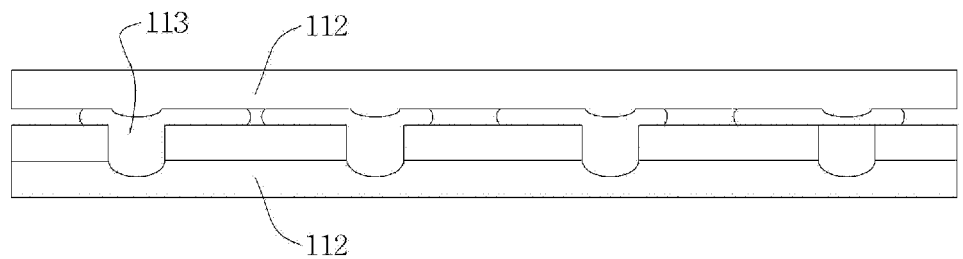
Figure 9:
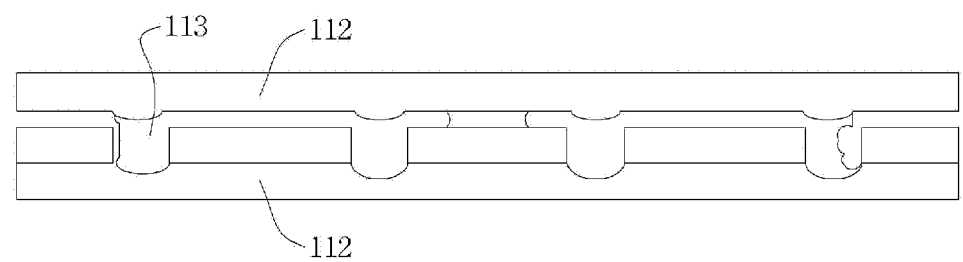

FIGS. 7 to 9 are views showing a problem occurring in a wafer-scale array of first barrel structures according to another comparative embodiment.

As shown in the figures, in the molding of a wafer-scale array of lens structures, when two adjacent liquid lens materials 113 meet together, surface tension causes one of the two liquid lens materials to be drawn out without filling the lens cavity, thereby leaving defects, such as voids, in the lens.

Figure 13:
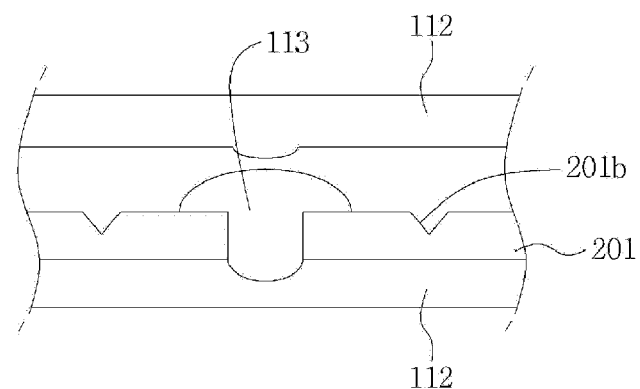
FIG. 13 is a view for explaining first barrel structures according to a second exemplary embodiment of the invention.

FIG. 13 is a view for explaining first barrel structures according to a second exemplary embodiment of the invention.

In addition to the height difference with a step shape as shown in FIGS. 4 to 6, the height difference 201b can have different shapes, such as a recess as shown in FIG. 13.

Figure 14:
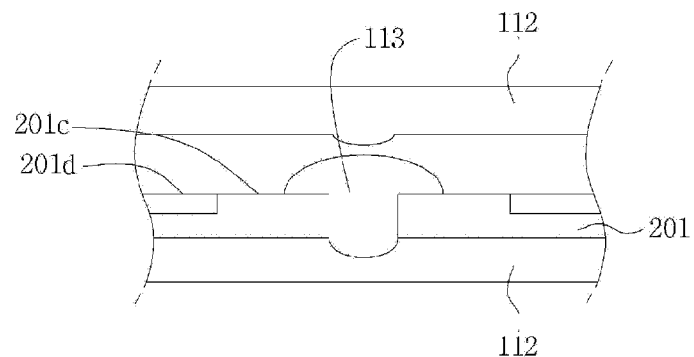
FIG. 14 is a view for explaining first barrel structures according to a third exemplary embodiment of the invention.

FIG. 14 is a view for explaining first barrel structures according to a third exemplary embodiment of the invention.

It is also possible to create a difference in the flow resistance using the difference in the wettability of the surface. Wettability is a measure of a surface pertaining to how well a liquid material spreads over the surface. The greater the wettability is, the easier the liquid material can spread over the surface.

For example, the surface condition is such that the roughness at the near position 201c that is relatively close to the wafer-scale array of lenses is greater than that at the distant position 201d that is far from the wafer-scale array of lenses.

Here, the surface roughness belongs to physical surface wettability. It should be noted that if the roughness is greater, the wettability is greater and the flow resistance is smaller, and thus spreading occurs with ease. If the roughness is smaller, the wettability is smaller and the flow resistance is greater, so spreading occurs with difficulty.

In this way, as the surface condition with greater roughness is provided at the near position, the liquid lens material freely spreads over the surface that has the greater roughness, but does not flow easily when it meets the surface that has the smaller roughness, since it is subjected to greater flow resistance.

Another type of wettability is chemical wettability, which is closely related with surface energy.

That is, the surface condition is such that surface energy is greater at the near position 201c, which is relatively close to the wafer-scale array of lenses, than at the distant position 201d, which is relatively far from the wafer-scale array of lenses. The wettability is greater if the surface energy is greater, that is, if the surface has a high capability to react with the liquid material. For this, hydrophilic (good wettability) treatment and hydrophobic (bad wettability) treatment can be performed, and a number of commonly used treatment materials and processes can be applied.

In this case, the liquid material, which has flowed freely over a surface that has high surface energy, stops proceeding further when it arrives at a surface that has low surface energy, since it is then subjected to great flow resistance.

Figure 15:
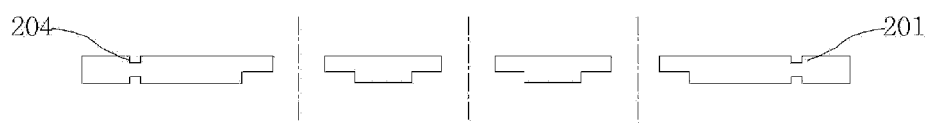
FIGS. 15 to 17 are schematic views showing a process of fabricating a wafer-scale array of lens structures according to a fourth exemplary embodiment of the invention.
Figure 16:
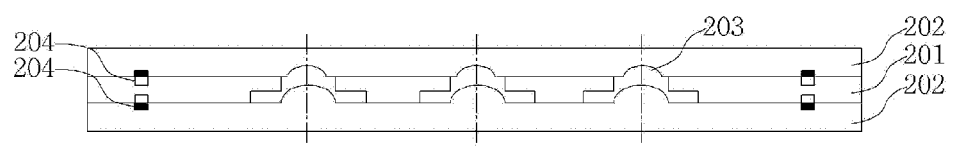
Figure 17:
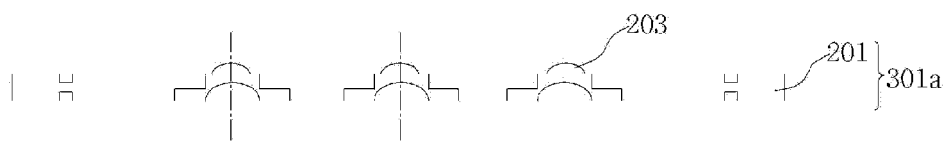

FIGS. 15 to 17 are schematic views showing a process of fabricating a wafer-scale array of lens structures according to a fourth exemplary embodiment of the invention.

The wafer-scale array of lens structures 301a is formed by replicating a wafer-scale array of lenses on a wafer-scale array of first barrel structures 201, which functions as a stop.

Here, it is preferred that the wafer-scale array of first barrel structures 201 in the form of a substrate be made of an opaque material that is a different kind from that of the lens material.

The lens material 203, an optical resin is applied onto the wafer-scale array of first barrel structures 201, which is made of the opaque material, and molds 202, each of which has a lens cavity array, is aligned with the wafer-scale array of first barrel structures 201 by means of alignment marks 204, and then the wafer-scale array of lenses is replicated. Thereby, the wafer-scale array of lens structures 301a, in which the wafer-scale array of first barrel structures 201 and the wafer-scale array of lenses are integrated, is fabricated.

Figure 18:
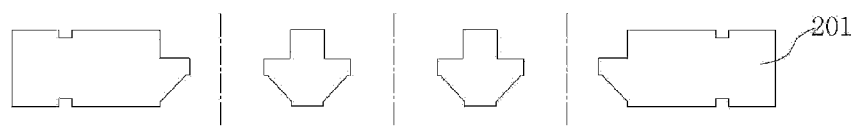
FIGS. 18 to 20 are schematic views showing a process of fabricating a wafer-scale array of lens structures according to a fifth exemplary embodiment of the invention.
Figure 19:
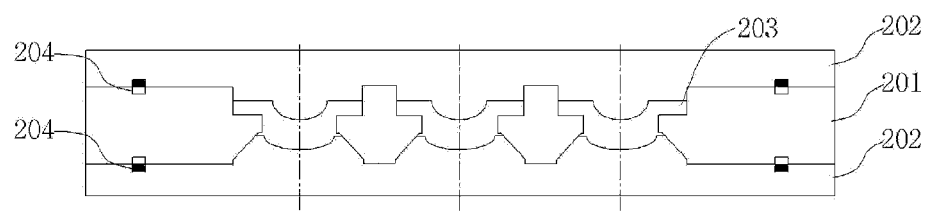
Figure 20:
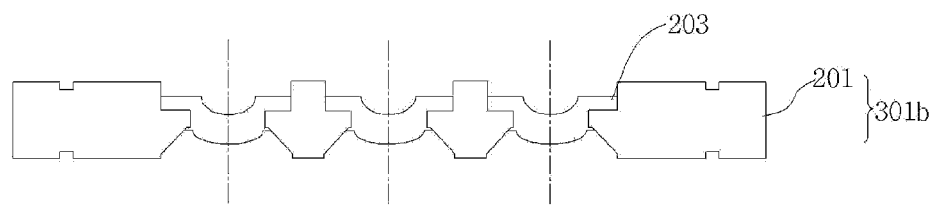

FIGS. 18 to 20 are schematic views showing a process of fabricating a wafer-scale array of lens structures according to a fifth exemplary embodiment of the invention.

The wafer-scale array of lens structures 301b is fabricated by replicating a wafer-scale array of lenses on the wafer-scale array of first barrel structures 201, which functions as a spacer and a vignetting structure. Similar to FIGS. 15 to 17, the wafer-scale array of lens structures 301b is formed on the wafer-scale array of first barrel structures 201 through a replication process using molds 202, each of which includes a lens cavity array and alignment marks 204.

Figure 21:
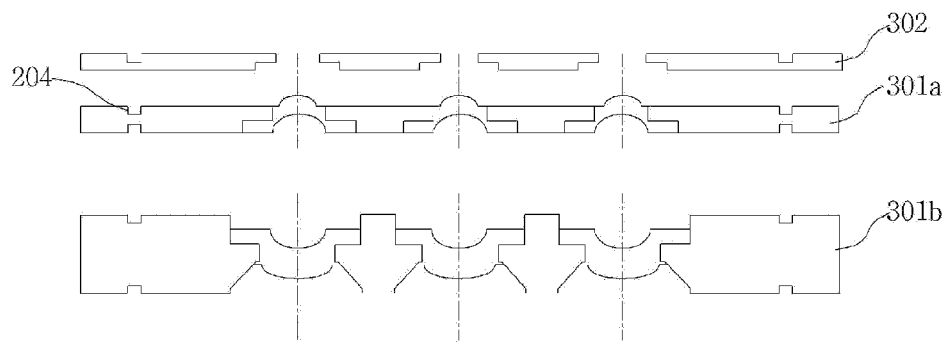
FIGS. 21 to 23 are schematic views showing a process of fabricating optical packages (i.e., lens modules) according to the fifth exemplary embodiment of the invention.
Figure 22:
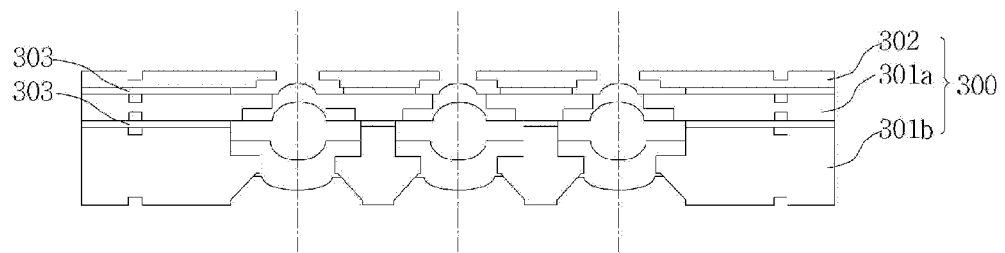
Figure 23:
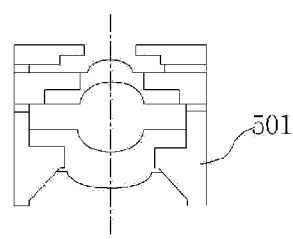

FIGS. 21 to 23 are schematic views showing a process of fabricating optical packages (i.e., lens modules 501) according to a sixth exemplary embodiment of the invention.

The camera lens modules 501 are fabricated by combining the wafer-scale array of lens structures 301a prepared using the method of FIGS. 15 to 17, the wafer-scale arrays of a lens structure 301b prepared by the method of FIGS. 18 to 20, and a wafer-scale array of second barrel structures 302, which serves as an uppermost vignetting structure, by stacking.

In the stacking process, an alignment is performed using alignment marks 204 formed in respective parts 301a, 301b, and 302.

The respective parts can be bonded to each other using adhesives 303. An anodic bonding process can be applied in the case in which the wafer-scale array of second barrel structures 302 is prepared using a silicon wafer. The wafer-scale array of optical packages (i.e., the lens modules) 300, in which the respective parts stack, is diced, thereby forming the lens modules 501.

The wafer-scale array of optical packages can include not only a plurality of the wafer-scale arrays of lens structures as shown in the figures but also a plurality of the wafer-scale arrays of second barrel structures.

Figure 24:
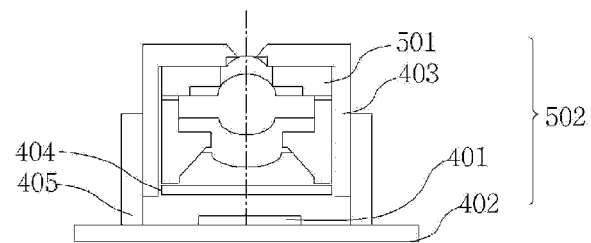
FIG. 24 is a schematic view showing an optical package (i.e., a camera device) according to a seventh exemplary embodiment of the invention.
Figure 25:
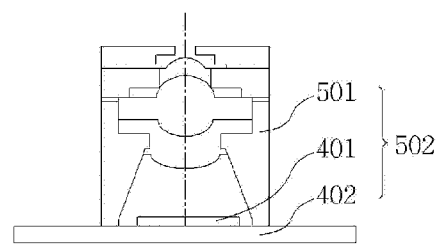
FIG. 25 is a schematic view showing an optical package (i.e., a camera device) according to an eighth exemplary embodiment of the invention.

FIGS. 24 and 25 are schematic views showing an optical package (i.e., a camera device) according to seventh and eighth exemplary embodiments of the invention.

Referring to FIG. 24, a camera device 502 is fabricated by a method similar to the existing process of fabricating a camera device. Specifically, an image sensor is mounted on, and a holder 405 is attached to, a Printed Circuit Board (PCB) 402. Afterwards, a barrel 403 with which a lens module 501 is combined is fixed to the holder 405.

Since the camera device fabricated as described above can perform a focus adjustment function, which is typical of existing camera devices, using the holder 405 and the barrel 403, a relatively large tolerance in the thickness of each part and an adhesive may be allowed in the process of fabricating the wafer-scale array of optical packages. This can serve as an advantageous factor in the initial development stage of the wafer-scale array of optical packages.

Reference numeral 404, which has not been described yet, indicates an infrared (IR) filter.

Referring to FIG. 25, a camera device is fabricated by attaching a lens module 501 directly to a PCB 402, on which an image sensor 401 is mounted.

This can reduce the number of parts and the cost of assembly, since neither a holder nor a barrel is required. Here, in the process of preparing the wafer-scale array of lens modules, IR filters are formed to coat the wafer-scale array of lens modules, or are stacked as a separate substrate.

The camera device shown in FIG. 25 is of a type in which the focal length of the lens module is not adjustable. Accordingly, only small alignment and thickness tolerances can be allowed in the fabrication of the wafer-scale array of lens modules, but the simplified process results in the reduction in manufacturing costs.

Figure 26:
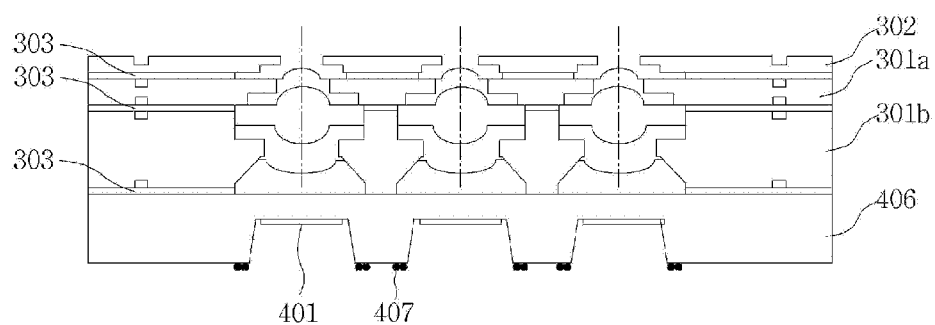
FIGS. 26 and 27 are schematic views showing a process of fabricating optical packages (i.e., camera devices) according to a ninth exemplary embodiment of the invention.
Figure 27:
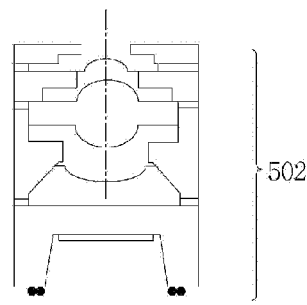

FIGS. 26 and 27 are schematic views showing a process of fabricating optical packages (i.e., camera devices) according to a ninth exemplary embodiment of the invention.

This is fabricated by stacking wafer-scale arrays of lens structures 301a and 301b and a wafer-scale array of second barrel structures 302 on a wafer-scale array of image sensor packages, which is prepared in the form of a Chip on Glass (COP) by packaging a wafer-scale array of image sensors on a glass substrate 406 having a trench.

Each image sensor 401 is packaged in the trench of the glass substrate 406.

It is preferred that IR filters be formed to coat the wafer-scale array of image sensor packages (i.e., the upper portion of the glass substrate 406 having the trench). Alternatively, the IR filters may be added to the stacked structure or formed to coat the wafer-scale arrays of lens structures 301a and 301b according to necessity.

Afterwards, individual camera devices as shown in FIG. 27 are fabricated through a dicing process.

Reference numeral 407, which has not been explained, indicates solder balls.

Figure 28:
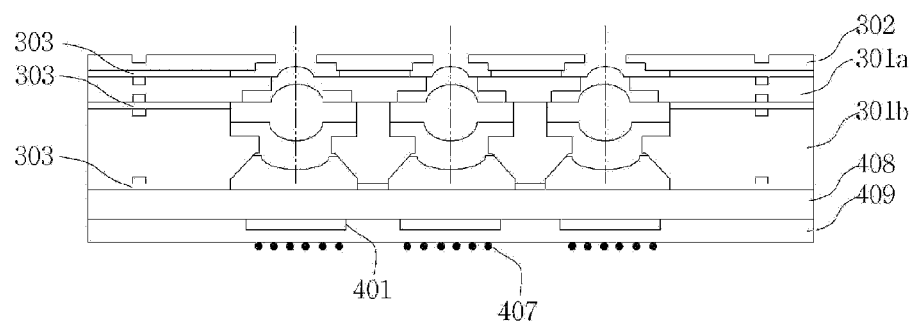
FIGS. 28 and 29 are schematic views showing a process of fabricating optical packages (i.e., camera devices) according to a tenth exemplary embodiment of the invention.
Figure 29:
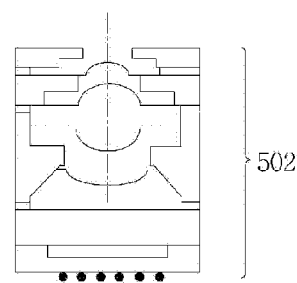

FIGS. 28 and 29 are schematic views showing a process of fabricating optical packages (i.e., camera devices) according to a tenth exemplary embodiment of the invention.

As shown in the figures, a cover glass 408 is attached onto a wafer-scale array of image sensor packages, in which a wafer-scale array of image sensors is packaged on a silicon wafer 409. In addition, wafer-scale arrays of lens structures 301a and 301b and a wafer-scale array of second barrel structures 302 are stacked onto the resultant structure, thereby forming camera devices 502.

Here, it is preferred that IR filters be formed to coat the cover glass 408. Alternatively, the IR filters are added to the stacked structure or formed to coat the wafer-scale arrays of lens structures 301a and 301b according to necessity. Finally, individual camera devices as shown in FIG. 29 are fabricated through a dicing process.

The structures shown in FIGS. 15 to 29 are provided as exemplary embodiments of the invention, in which various types of wafer-scale arrays of barrel structures can be used for the fabrication of a wafer-scale array of lens structures. In addition, for the fabrication of a wafer-scale array of optical packages, a necessary number of wafer-scale arrays of lens structures and a wafer-scale array of barrel structures, which will function as holders, barrels, apertures, vignetting structures, stops, spacers, IR filters, cover glasses, or the like, are used.

In addition, according to necessity, a deposition process for forming stops onto a respective wafer-scale array of lens structures can be performed, and a coating process of an IR blocking layer can be performed.

The wafer-scale array of barrel structures of the invention can be fabricated through dry or wet etching of a silicon wafer, injection molding or thermal compression molding of a thermoplastic polymer material, thermal polymerization molding of a heat-curable material, photo-polymerization molding of a photo-curable material, punching of a metal substrate, or the like.

The process of replicating the wafer-scale array of lenses on the wafer-scale array of barrel structures can be carried out through thermal compression molding of a thermoplastic resin, thermal polymerization molding of a heat-curable material, or photo-polymerization molding of a photo-curable material.

In the case of the wafer-scale array of lenses fabricated through photo-polymerization molding, a part or the entirety of the mold is preferably made of a transparent material, so that light can reach the lens material.

In the process of replicating the wafer-scale array of lenses on the wafer-scale array of first barrel structures, the lens material may be applied on the entire surface of the wafer-scale array of first barrel structures. However, it is preferred that a fixed amount of the lens material be discontinuously applied only on each array of through-holes. This is more advantageous in controlling the thickness tolerance of optical packages, since a residual layer is not formed on areas other than the lens area.

In the case in which the wafer-scale array of lens structures is prepared through thermal polymerization molding of a heat-curable material or photo-polymerization molding of a photo-curable material, it is possible to advantageously apply the high heat resistance characteristics of the heat-curable material or the photo-curable material to a process of mounting camera devices.

In this case, the wafer-scale arrays of first and second barrel structures are also made of one or more selected from among silicon, glass, metal, and heat resistant polymer, which have high heat resistance.

It is preferred that the wafer-scale array of lens structures (i.e., the wafer-scale array of lenses and the wafer-scale array of first barrel structures) and the wafer-scale array of second barrel structures be made of a material that is able to withstand a temperature of 240° C. or more after having been molded.

At present, various electronic appliances using a camera device are fabricated by mounting a plurality of components on the surface of a main circuit board through soldering, followed by attaching a camera device. However, the high heat resistance camera device of the invention can be mounted on the surface of the main circuit board together with other components, thereby contributing to a reduction in the unit cost of the electronic appliances having the camera device.

The invention claimed is:

1. A wafer-scale array of optical packages, comprising:
at least one wafer-scale array of lens structures, including a wafer-scale array of first barrel structures and a wafer-scale array of lenses directly formed on the wafer-scale array of first barrel structures such that the wafer-scale array of lenses is integrally combined with the wafer-scale array of first barrel structures, the wafer-scale array of first barrel structures being made of a material different from a material of the wafer-scale array of lenses; and
at least one wafer-scale array of second barrel structures stacked on and combined with the at least one wafer-scale array of lens structures,
wherein the wafer-scale array of first barrel structures has a surface condition that resistance to flow of the material of the wafer-scale array of lenses in a liquid state varies according to position,
the surface condition of the wafer-scale array of first barrel structures is such that the resistance is smaller at a near position than at a distant position, the near position being nearer to the wafer-scale array of lenses than the distant position, and
the wafer-scale array of first barrel structures has a height difference on a surface thereof, wherein the height difference is higher at the near position than at the distant position.

2. The wafer-scale array of optical packages according to claim 1, further comprising a wafer-scale array of image sensor packages stacked to be combined with the at least one wafer-scale array of lens structures and the at least one wafer-scale array of second barrel structures, wherein the wafer-scale array of image sensor packages is of a chip-on-glass type that includes a glass substrate and a wafer-scale array of image sensors packaged on the glass substrate.

3. The wafer-scale array of optical packages according to claim 1, further comprising a wafer-scale array of image sensor packages stacked to be combined with the at least one wafer-scale array of lens structures and the at least one wafer-scale array of second barrel structures, wherein the wafer-scale array of image sensor packages includes a silicon wafer and a wafer-scale array of image sensors packaged on the silicon wafer.

4. The wafer-scale array of optical packages according to claim 1, wherein each barrel structure of the wafer-scale array of first barrel structures and the at least one wafer-scale array of second barrel structures comprises one selected from the group consisting of a holder, a barrel, an aperture, a vignetting structure, a stop, a spacer, an infrared filter, and a cover glass.

5. The wafer-scale array of optical packages according to claim 1, wherein the wafer-scale array of first barrel structures comprises an array of through-holes, wherein the wafer-scale array of lenses is formed on the array of through-holes.

6. The wafer-scale array of optical packages according to claim 5, wherein the wafer-scale array of first barrel structures is opaque.

7. The wafer-scale array of optical packages according to claim 1, wherein the height difference has a shape of a step or a recess.

8. A wafer-scale array of optical packages, comprising:
at least one wafer-scale array of lens structures, including a wafer-scale array of first barrel structures and a wafer-scale array of lenses directly formed on the wafer-scale array of first barrel structures such that the wafer-scale array of lenses is integrally combined with the wafer-scale array of first barrel structures, the wafer-scale array of first barrel structures being made of a material different from a material of the wafer-scale array of lenses; and
at least one wafer-scale array of second barrel structures stacked on and combined with the at least one wafer-scale array of lens structures,
wherein the wafer-scale array of first barrel structures has a surface condition that resistance to flow of the material of the wafer-scale array of lenses in a liquid state varies according to position,
the surface condition of the wafer-scale array of first barrel structures is such that the resistance is smaller at a near position than at a distant position, the near position being nearer to the wafer-scale array of lenses than the distant position, and
the wafer-scale array of first barrel structures has a surface energy that is greater at the near position than at the distant position.

9. The wafer-scale array of optical packages according to claim 8, further comprising a wafer-scale array of image sensor packages stacked to be combined with the at least one wafer-scale array of lens structures and the at least one wafer-scale array of second barrel structures.

10. The wafer-scale array of optical packages according to claim 8, wherein each barrel structure of the wafer-scale array of first barrel structures and the at least one wafer-scale array of second barrel structures comprises one selected from the group consisting of a holder, a barrel, an aperture, a vignetting structure, a stop, a spacer, an infrared filter, and a cover glass.

11. The wafer-scale array of optical packages according to claim 8, wherein the wafer-scale array of first barrel structures comprises an array of through-holes, and the wafer-scale array of lenses is formed on the array of through-holes.

12. The wafer-scale array of optical packages according to claim 8, wherein the wafer-scale array of first barrel structures is opaque.

13. A method for fabricating a wafer-scale array of optical packages, comprising:
a first step of preparing at least one wafer-scale array of lens structures by forming a wafer-scale array of lenses directly on a wafer-scale array of first barrel structures such that the wafer-scale array of lenses is integrally combined with the wafer-scale array of first barrel structures, the wafer-scale array of first barrel structures being made of a material different from a material of the wafer-scale array of lenses; and
a second step of combining at least one wafer-scale array of second barrel structures with the at least one wafer-scale array of lens structures by stacking.

14. The method according to claim 13, wherein each barrel structure of the wafer-scale array of first barrel structures and the at least one wafer-scale array of second barrel structures comprises one selected from the group consisting of a holder, a barrel, an aperture, a vignetting structure, a stop, a spacer, an infrared filter, and a cover glass.

15. The method according to claim 13, wherein the wafer-scale array of first barrel structures is prepared through injection molding or thermal compression molding of a thermoplastic resin.

16. The method according to claim 13, wherein the wafer-scale array of first barrel structures is prepared through etching of a silicon wafer.

17. The method according to claim 13, wherein the wafer-scale array of first barrel structures is prepared through punching of a thin-sheet substrate.

18. The method according to claim 13, wherein the wafer-scale array of lenses is formed through thermal polymerization molding of a heat-curable resin.

19. The method according to claim 13, wherein the wafer-scale array of lenses is formed through photo-polymerization molding of a photo-curable resin.

20. The method according to claim 13, wherein the wafer-scale array of lenses is formed through thermal compression molding of a thermoplastic material.

21. The method according to claim 13, wherein the wafer-scale array of first barrel structures comprises an array of through-holes, and
wherein the first step comprises injecting a fixed amount of the material of the wafer-scale array of lenses on the array of through-holes and then replicating the wafer-scale array of lenses.

22. The method according to claim 21, wherein the wafer-scale array of first barrel structures is opaque.

23. The method according to claim 13, wherein the wafer-scale array of first barrel structures is made of one or more selected from the group consisting of glass, silicon, metal, and thermosetting resin, which have high heat resistance, and wherein the wafer-scale array of lenses is formed through thermal polymerization molding or photo-polymerization molding.

24. The method according to claim 23, wherein the material of the wafer-scale array of first barrel structures and the material of the wafer-scale array of lenses can withstand a temperature of 240° C. or more after having been molded.

25. The method according to claim 13, wherein the first step comprises supplying the material of the wafer-scale array of lenses in a liquid state onto the wafer-scale array of first barrel structures and then forming the wafer-scale array of lenses through molding, and wherein the wafer-scale array of first barrel structures has a surface condition that resistance to flow of the material of the wafer-scale array of lenses in the liquid state varies according to position.

26. The method according to claim 25, wherein the surface condition of the wafer-scale array of first barrel structures is such that the resistance is smaller at a near position than at a distant position, the near position being nearer to the wafer-scale array of lenses than the distant position.

27. The method according to claim 26, wherein the wafer-scale array of first barrel structures has a height difference on a surface thereof, wherein the height difference is higher at the near position than at the distant position.

28. The method according to claim 27, wherein the height difference has a shape of a step or a recess.

29. The method according to claim 26, wherein the wafer-scale array of first barrel structures has roughness on a surface thereof, wherein the roughness is greater at the near position than at the distant position.

30. The method according to claim 26, wherein the wafer-scale array of first barrel structures has a surface energy that is greater at the near position than at the distant position.

31. The method according to claim 13, wherein the second step comprises combining a wafer-scale array of image sensor packages with the at least one wafer-scale array of lens structures and the at least one wafer-scale array of second barrel structures by stacking, wherein the wafer-scale array of image sensor packages is of a chip-on-glass type that includes a glass substrate and a wafer-scale array of image sensors packaged on the glass substrate.

32. The method according to claim 13, wherein the second step comprises combining a wafer-scale array of image sensor packages with the at least one wafer-scale array of lens structures and the at least one wafer-scale array of second barrel structures by stacking, wherein the wafer-scale array of image sensor packages includes a silicon wafer and a wafer-scale array of image sensors packaged on the silicon wafer.

33. The method for fabricating an optical package comprising:
   preparing a wafer-scale array of optical packages by the method recited in claim 13; and
   producing an individual optical package by dicing the wafer-scale array of optical packages.

34. The method according to claim 33, further comprising combining the produced individual optical package directly onto a printed circuit board on which an image sensor is mounted.

35. The method according to claim 33, further comprising combining a holder onto a printed circuit board on which an image sensor is mounted, combining the produced individual optical package to a barrel, and then combining the barrel to the holder.

* * * * *